United States Patent [19]
Yoda et al.

[11] Patent Number: 4,876,223
[45] Date of Patent: Oct. 24, 1989

[54] METHOD OF MANUFACTURING SEMICONDUCTOR DEVICES

[75] Inventors: Takashi Yoda; Tohru Watanabe, both of Yokohama, Japan

[73] Assignee: Kabushiki Kaisha Toshiba, Kawasaki, Japan

[21] Appl. No.: 260,300

[22] Filed: Oct. 20, 1988

[30] Foreign Application Priority Data

Oct. 21, 1987 [JP] Japan .............................. 62-265943

[51] Int. Cl.$^4$ ..................... H01L 21/00; H01L 21/02; H01L 21/306; H01L 21/465
[52] U.S. Cl. .................................. 437/228; 437/229; 437/187; 437/195; 156/659.1; 148/DIG. 51
[58] Field of Search ............... 437/228, 229, 187, 189, 437/195; 156/654, 659.1

[56] References Cited
U.S. PATENT DOCUMENTS 4,290,668  9/1981  Ellis et al. ............................ 427/163

Primary Examiner—Brian E. Hearn
Assistant Examiner—B. Everhart
Attorney, Agent, or Firm—Foley & Lardner, Schwartz, Jeffery, Schwaab, Mack, Blumenthal & Evans

[57] ABSTRACT

A method of manufacturing a semiconductor device whereby a wiring material is filled within a recess of an insulating film, with the upper surface of the wiring material being uneven, a coating film being evenly deposited on the wiring material, the wiring material and the coating film being etched with tetra-methyl-guanidine having the same etching speed with respect to the wiring material and the coating film in such a manner that the upper surface of the wiring material filled within the recess is made substantially flat and substantially flush with the upper surface of the insulating film. A tetra-methyl-guanide may be used which has a higher etching speed with respect to the wiring material than the coating film. In this case, the wiring material has an indentation above the recess, and the coating film is thick above the recess and thin above the insulating film. Therefore, the wiring material within the recess is etched in such a manner that the upper surface of the wiring material within the recess is made flat and substantially flush with the upper surface of the insulating film.

9 Claims, 6 Drawing Sheets

METHOD OF MANUFACTURING SEMICONDUCTOR DEVICES

BACKGROUND OF THE INVENTION

1. Field of the Art

The present invention relates to a method of manufacturing a semiconductor device, and more particularly to a method of manufacturing a semiconductor device with a recess of an insulating layer filled with wiring material.

2. Prior Art

As elements formed in a semiconductor device become fine, a contact hole formed in an insulating layer also becomes fine. It is accordingly difficult to reliably form an Al film within a contact hole. The reason for this is that the step coverage of an Al film to the contact hole is poor so that the Al film becomes too thin at the side walls of a contact hole.

To solve the above problem, there has been proposed a method whereby an Al film is deposited on an insulating layer to fill a contact hole with the Al film, the Al film on the insulating layer is etched back with the Al film within the contact hole remaining unetched, and then a wiring Al film is deposited. According to this method, since almost all space within the contact hole is filled with Al, there is no problem of a poor step coverage.

The above conventional etch-back method will be detailed with reference to FIGS. 6A and 6B. The semiconductor device shown in FIGS. 6A and 6B has a barrier layer made of titanium nitride film or the like which is formed prior to filling an Al film, in order to avoid possible junction breakage.

Referring to FIG. 6A, a semiconductor substrate 1 is formed with specific regions 2a and 2b such as source, drain or the like to which an Al wiring is to be connected. An insulating layer 3 formed on the semiconductor substrate 1 has contact holes 3a and 3b formed above the specific regions 2a and 2b. The contact holes 3a and 3b are deposited with a barrier layer 4 for avoiding possible junction breakage. An Al film 5 is deposited on the entire surface of the barrier layer 4 to fill the Al film within the contact holes 3a and 3b. The Al film 5 thus formed will have indentations 5a and 5b because of the presence of the contact holes 3a and 3b. The depths of the indentations 5a and 5b are dependent on the cross sectional areas of the contact holes 3a and 3b. After etching back the Al film 5, Al remains within the contact holes 3a and 3b as shown in FIG. 6B. The indentations 5a and 5b are transformed into indentations 5a' and 5b' on the Al films 5 left within the contact holes, because of isotropic etching. The quantities of the Al films 5 left within the contact holes 3a and 3b are respectively dependent on the cross sectional areas of the contact holes, and there is a large difference between the indentations 5a' and 5b'. Therefore, even if another Al film is deposited on the Al-films 5 left within the contact holes, electrical contact between the new and old Al films may not be given. Such case occurs not only for contact holes but also for various recesses such as wiring trenches.

FIG. 7 shows another example of a semiconductor device manufactured in accordance with the abovedescribed conventional method. As seen from FIG. 7, a contact hole (or wiring trench) 3a (3c) of an interlayer insulating film 3 on a semiconductor substrate 1 is filled with an Al film. After etching, an Al film 5A remains unetched. If another interlayer film 10 is deposited after a wiring Al film 7 is deposited, a cavity 10a becomes present in some cases as shown in FIG. 7.

As described above, according to the conventional method, a wiring material filled within a recess such as a contact hole is etched back. The etched-back surface of the wiring material within the recess has an indentation so that if another wiring material is deposited on the remaining wiring material within the recess, both the materials may not reliably contact each other, or if another interlayer insulating film is deposited on the other wiring material, a cavity may be formed.

SUMMARY OF THE INVENTION

It is an object of the present invention to provide a method of manufacturing a semiconductor device whereby a flat etched-back surface of a wiring material is obtained irrespective of the presence of a recess such as a contact hole.

According to the present invention, a wiring material film is formed on an insulating film on a semiconductor substrate. The wiring material film covers the surface of the insulating film and is filled within the recess. In this condition, the surface of the wiring material film has an indentation above the recess.

Next, a coating film is coated over the surface of the wiring material film. The indentation on the surface of the wiring material film is filled with the coating film so that the surface of the coating film becomes flat.

Then, the coating film and the wiring material film are etched with tetra-methyl-guanidine (T.M.G.). After etching, the wiring material within the recess has a flat surface.

According to the present invention, it is possible to fill a wiring material having a flat surface within a recess of an insulating film on a semiconductor substrate.

DETAILED DESCRIPTION OF THE PREFERRED EMBODIMENTS

Figure 1A:
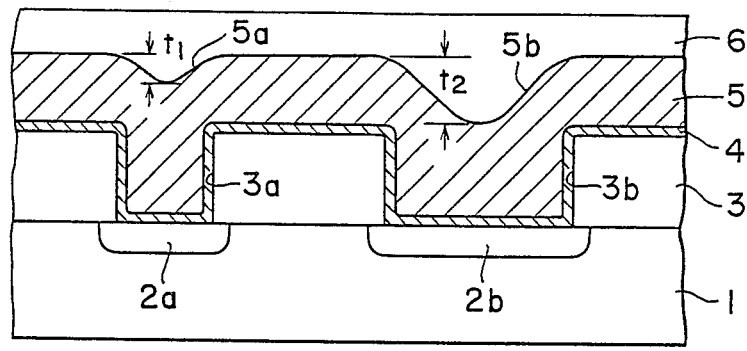
FIGS. 1A to 1C are cross sections showing processes of the manufacturing method according to a first embodiment of the present invention.
Figure 1B:
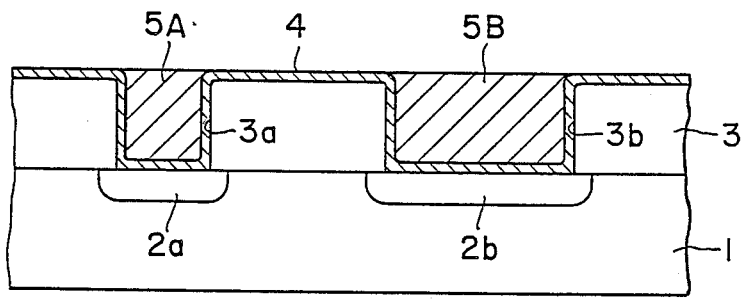
Figure 1C:
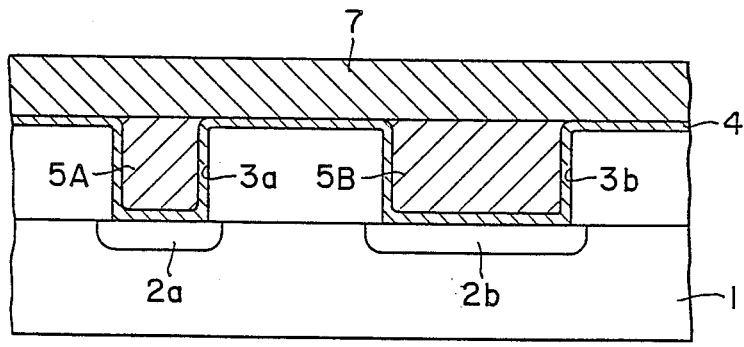

FIGS. 1A to 1C are cross sections showing the processes of the manufacturing method of a first embodiment of the present invention.

Referring to FIG. 1A, a semiconductor substrate 1 is formed with specific regions 2a and 2b such as source, drain or the like to which an Al wiring is to be connected. An insulating layer 3 formed on the semiconductor substrate 1 has contact holes 3a and 3b formed above the specific regions 2a and 2b. The contact holes 3a and 3b and the insulating layer 3 are deposited with a barrier layer 4 for avoiding possible junction breakage. An Al film 5 is deposited on the entire surface of the barrier layer 4 to fill the Al film within the contact holes 3a and 3b, by means of sputtering at high temperature. The Al film 5 thus formed will have indentations 5a and 5b because of the presence of the contact holes 3a and 3b. The depths t1 and t2 of the indentations 5a and 5b are dependent on the sizes (cross sectional areas) of the contact holes 3a and 3b. The depths of the indentations 5a and 5b are approximately in the order of 2000 Å. A resist 6 with low viscosity is coated on the entire surface of the Al film 5, the surface of the resist 6 being flat.

Next, the partially fabricated semiconductor device shown in FIG. 1A is dipped within an etching liquid (T.M.G. aqueous solution) which has the same etching speed with respect to the resist 6 and the Al film 5. The resist 6 and Al film 5 are etched at the same etching speed to obtain the semiconductor device as shown in FIG. 1B. In particular, the surfaces of the Al films 5A and 5B left unetched within the contact holes 3a and 3b become flat irrespective of the sizes of the contact holes 3a and 3b.

Next, an Al film 7 is deposited on the surface of the partially fabricated semiconductor device shown in FIG. 1B by means of sputtering. This process can be reliably performed because of the flat surface of the Al films 5A and 5B. Thus, the Al films 5A and 5B are in reliable contact with the Al film 7. It is apparent that no cavity is formed even if an interlayer insulating film is deposited on the Al film 7.

In the above embodiment and other embodiments described later, resin such as polyimide resin may be used instead of the resist.

Figure 2:
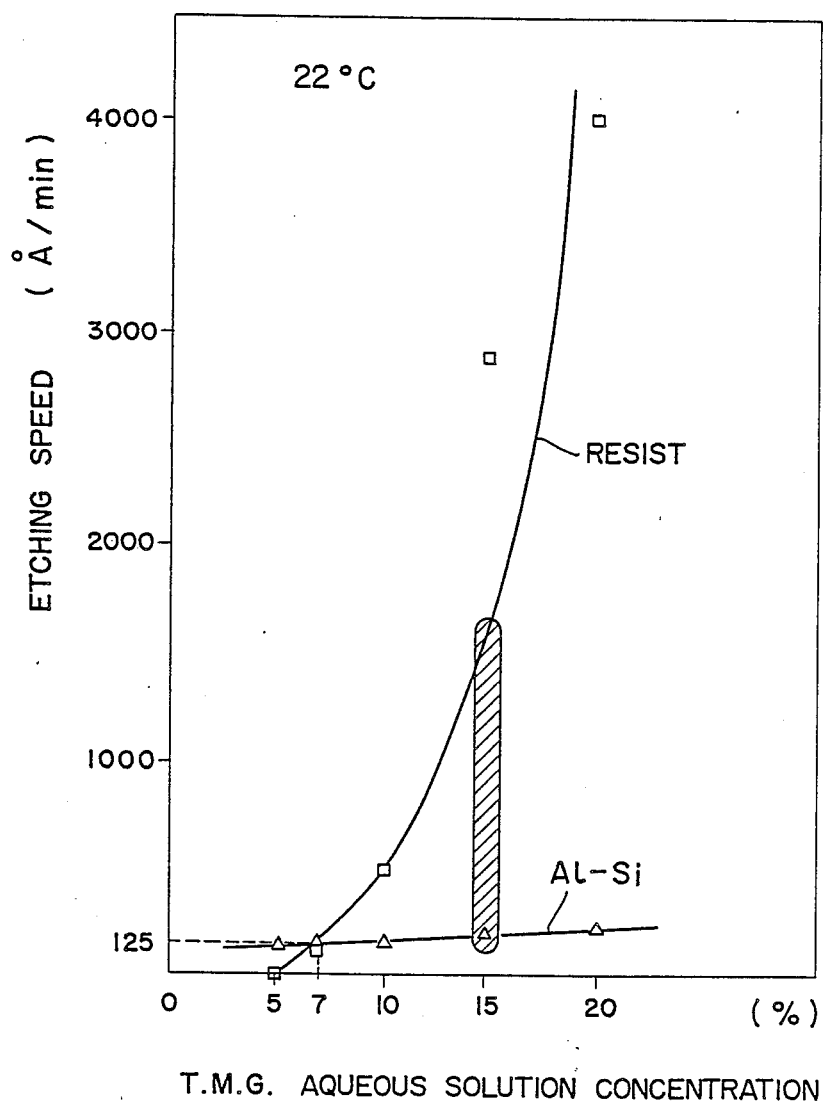
FIG. 2 is a graph showing a relationship between the concentration of T.M.G. aqueous solution and the etching speed with respect to Al, Si and resist.

The T.M.G. aqueous solution used in the etching process in the above embodiment has the characteristics as shown in FIG. 2. The etching liquid has the same etching speed of 125 Å/min with respect to Al (indicated by 5 in FIG. 1A) and resist (indicated by 6 in FIG. 1A) if the concentration of the aqueous solution is about 7%. Therefore, the T.M.G. aqueous solution with about 7% concentration can be used as the etching liquid.

Figure 3:
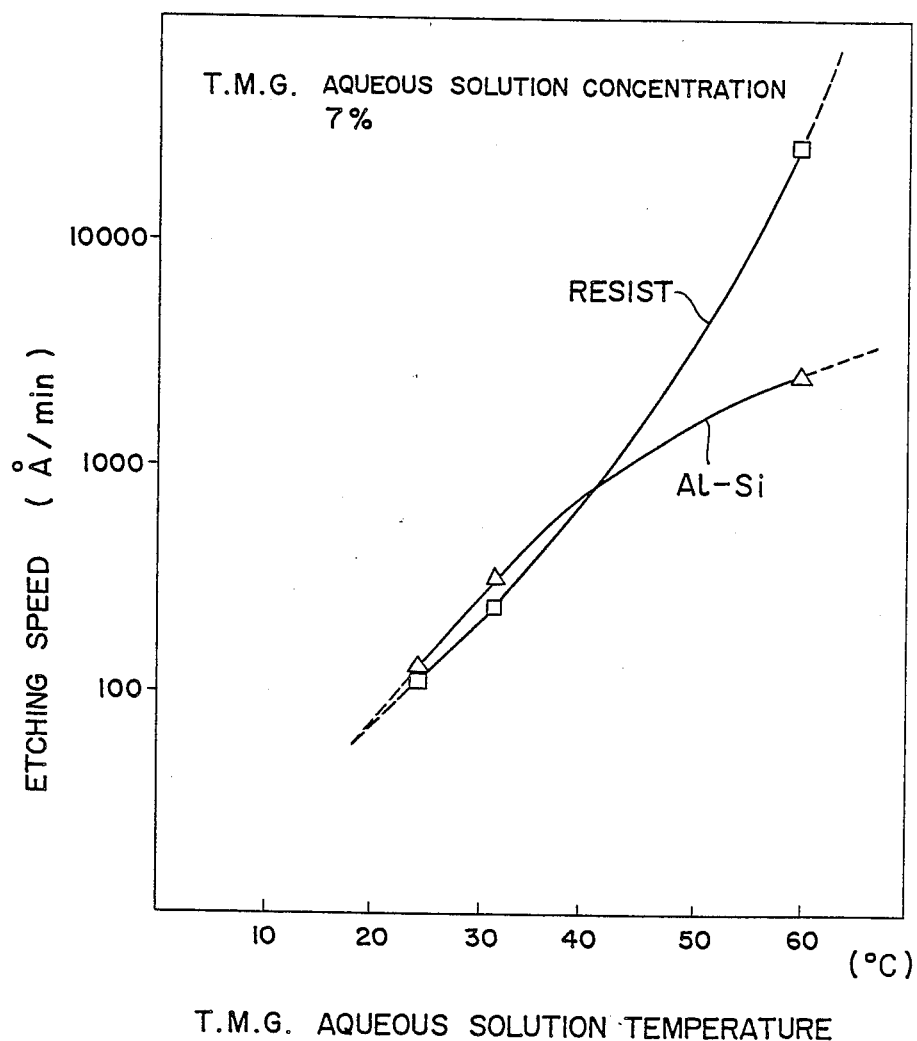
FIG. 3 is a graph showing a relationship between the temperature of T.M.G. aqueous solution and the etching speed with respect to Al, Si and resist.

FIG. 3 shows the etching speed of a T.M.G. aqueous solution of 7% concentration with respect to Al and Si while using the temperature of the solution as a variable. As seen from FIG. 3, the etching speed with respect to the resist and Al becomes equal at about 41° C.

Figure 4A:
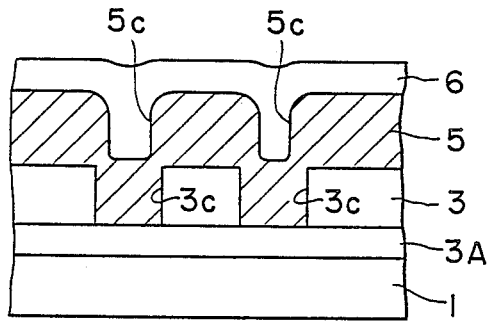
FIGS. 4A and 4B are cross sections showing the processes of the manufacturing method according to a second embodiment of the present invention.
Figure 4B:
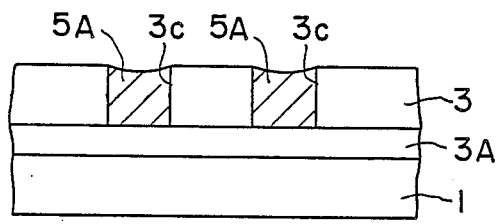

FIGS. 4A and 4B show a second embodiment of the manufacturing method. Like elements to those shown in FIGS. 1A to 1C are designated using identical reference numerals in FIGS. 4A and 4B. An interlayer insulating film 3 is represented by 3A.

Figure 4C:
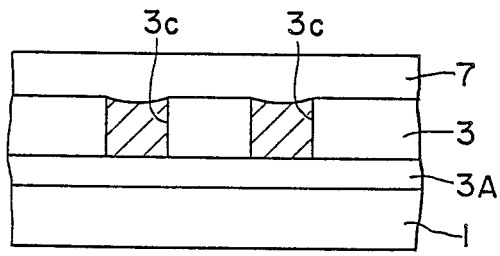

Referring to FIG. 4A, a wiring trench 3c formed in the interlayer insulating film 3 is filled with an Al film 5 by means of sputtering. The Al film 5 thus formed will have a groove 5c on the surface thereof. A resist 6 is deposited on the Al film 5 to fill the groove 5c with the resist 6. Then, the resist 6 and Al film 5 are etched using an etching liquid having the same etching speed with respect to the resist 6 and Al film 5, thus enabling the surface of the Al film which is remained unetched within the trench 3c to be made flat, as shown in FIG. 4B. Next, as shown in FIG. 4C, an Al film 7 is deposited by means of sputtering.

Figure 5A:
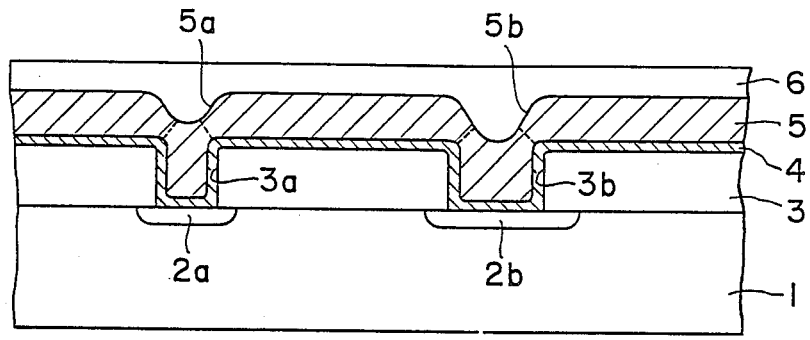
FIGS. 5A to 5C are cross sections showing the processes of the manufacturing method according to a third embodiment of the present invention.
Figure 5B:
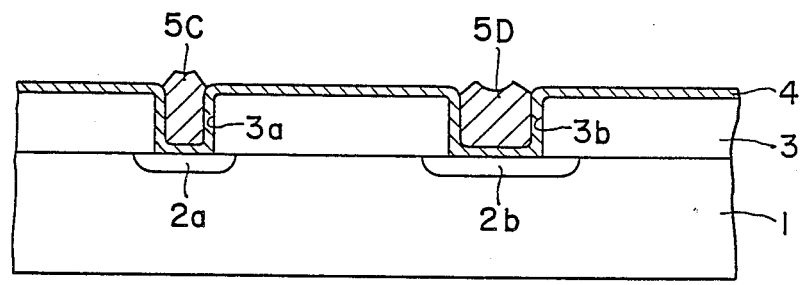
Figure 5C:
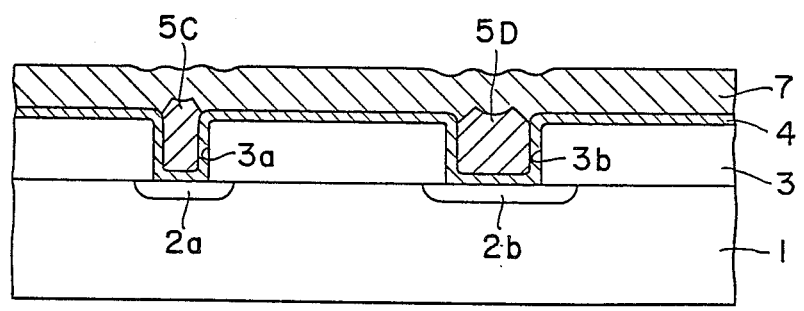
Figure 6A:
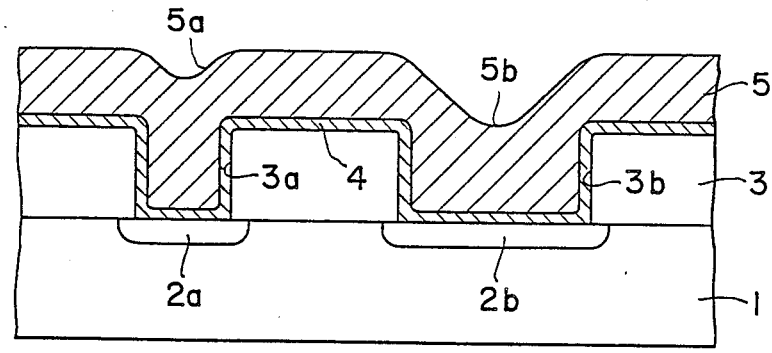
FIGS. 6A and 6B are cross sections showing the processes of the conventional manufacturing method.
Figure 6B:
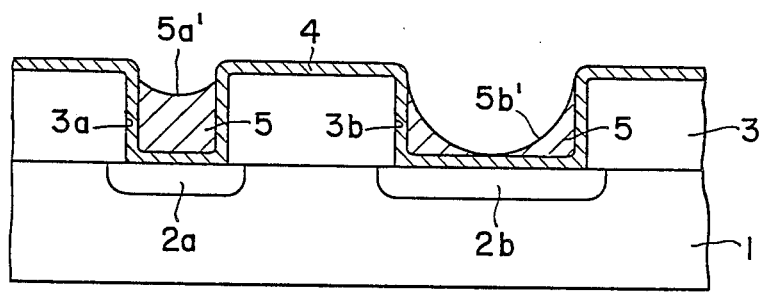
Figure 7:
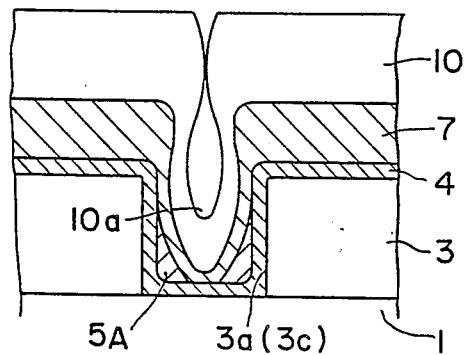
FIG. 7 is a cross section showing an example of a semiconductor device manufactured by the conventional method.

FIGS. 5A to 5C show a third embodiment of the manufacturing method of this invention.

The partially fabricated semiconductor device shown in FIG. 5A, which is the same as that shown in FIG. 1A, is dipped within an etching liquid which has a higher etching speed with respect to the Al film 5 than the resist 6. As such an etching liquid, a T.M.G. aqueous solution with about 15% concentration at 22° C. is used, as appreciated from the hatching portion in FIG. 2. The resist 6 and Al film 5 are etched with the etching liquid to obtain the semiconductor device shown in FIG. 5B. In other words, the resist 6 is completely etched off and the Al film 5 is etched to the position indicated by broken lines in FIG. 5A. Al films remaining unetched within the contact holes 3a and 3b have a relatively small difference in surface shape therebetween.

Next, as shown in FIG. 5C, an Al film 7 is deposited on the Al films 5C and 5D. Since there is a small difference in surface shape between the Al films 5C and 5D, the Al film 7 can be in reliable contact with the Al films 5C and 5D.

A T.M.G. aqueous solution used in this invention can reliably remove the resist without giving any damage to Al, Si or SiO$_2$ under the resist. This fact will be described in detail taking as an example the case of removing a resist after the patterning of an Al wiring.

To remove the resist used in the photo-etching process (PEP), an SH process or an O$_2$ Asher method has been generally used. The SH process is used to remove a resist on a layer except an Al layer. However, since acid mists are generated, a problem of generating rust on the device, or other problems may arise. In addition, there remains a problem of safety, such as influence upon human body. The O$_2$ Asher method has a problem of being likely to receive ion damage because of exposure to O$_2$ plasma, and also the problem of a low productivity.

However, if a high concentration T.M.G. aqueous solution is used to remove a resist, no damage is given to the device, the influence of acid contamination and the like upon human body is considerably reduced, and the generation of mists can be greatly suppressed.

In particular, an insulation film is first formed on a semiconductor substrate. An Al film is deposited thereon by means of sputtering. A resist is coated on the entire surface of the Al film. Thereafter, the resist is patterned in a desired shape by a photo-etching process (PEP). The Al film is subjected to anisotropic etching, by using the patterned resist as a mask. The resist is then etched by a T.M.G. aqueous solution which, e.g., is used at 22° C. and has a 15% concentration as shown in FIG. 2. The T.M.G. aqueous solution of 15% concentration has a higher etching speed with respect to the resist than Al and Si as seen from FIG. 2. Therefore, only the resist is etched, without giving any damage to the Al film under the resist. A resist of both negative and positive types can be etched by the T.M.G. aqueous solution. Since the T.M.G. aqueous solution is alkaline, it neither degrades the working environment due to such as acid contamination, nor greately influences human body, and has a very high stability. The T.M.G. aqueous solution has the characteristics as shown in FIG. 2 so that the process management such as temperature control is not needed.

The T.M.G. aqueous solution can be used to remove not only a resist on an Al film, but also a resist on an Si film or an SiO$_2$ film.

What is claimed is:

1. A method of manufacturing a semiconductor device comprising the steps of:

forming an insulating film on a semiconductor substrate;

forming a recess such as a contact hole, wiring trench or the like in said insulating film;

forming a wiring material film on said insulating film and said recess to fill said wiring material at least within said recess;

coating a coating film on the surface of said wiring material film in a manner to make the surface of said coating film flat;

etching said coating film and said wiring material film sequentially, by using tetra-methyl-guanidine having the same etching speed with respect to said coating film and said wiring material film, to leave said wiring material film only within said recess and remove said wiring material film on said insulating film, in such a manner that the upper surface of said wiring material film left unetched within said recess is made substantially flush with the upper surface of said insulation film, and is made substantially flat; and forming another wiring material film on said wiring material film and said insulation film to obtain electric connection between said other wiring material film and said wiring material film.

2. A method according to claim 1, further comprising a step of forming a barrier layer within said recess and on said insulating film, between said recess forming step and said wiring material film filling process.

3. A method according to claim 1, wherein said wiring material film is made of Al, said coating film is a resist, and said tetra-methyl-guanidine is used at 22° C. and has an aqueous solution concentration of about 7%.

4. A method according to claim 3, wherein said coating film is made of a polyimide-based resin.

5. A method according to claim 1, wherein said insulating film is formed on said semiconductor substrate with an interlayer insulating interposed therebetween.

6. A method of manufacturing a semiconductor device comprising the steps of:

forming an insulating film on a semiconductor substrate;

forming a recess such as a contact hole, wiring trench or the like in said insulating film;

forming a wiring material film on said insulating film and said recess to fill said wiring material at least within said recess;

coating a coating film on the surface of said wiring material film in a manner to make flat the surface of said coating film;

etching said coating film and said wiring material film sequentially, by using tetra-methyl-guanidine having a higher etching speed with respect to said wiring material film than said coating film, to leave said wiring material film only within said recess and remove said wiring material film on said insulating film, in such a manner that the upper surface of said wiring material film left unetched within said recess is made substantially flush with the upper surface of said insulation film, and is made substantially flat; and forming another wiring material film on said wiring material film and said insulation film to obtain electric connection between said other wiring material film and said wiring material film.

7. A method according to claim 6, further comprising a step of forming a barrier layer within said recess and on said insulating film, between said recess forming step and said wiring material film filling process.

8. A method according to claim 6, wherein said wiring material film is made of Al, said coating film is a resist, and said tetra-methyl-guanidine is used at 22° C. and has an aqueous solution concentration of about 15%.

9. A method according to claim 8, wherein said coating film is made of a polyimide-based resin.

* * * * *